(12) United States Patent  (10) Patent No.: US 8,039,326 B2
Knorr et al.  (45) Date of Patent: Oct. 18, 2011

(54) METHODS FOR FABRICATING BULK FINFET DEVICES HAVING DEEP TRENCH ISOLATION

(75) Inventors: Andreas Knorr, Wappingers Falls, NY (US); Frank Scott Johnson, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 12/544,931

(22) Filed: Aug. 20, 2009

(65) Prior Publication Data

US 2011/0045648 A1 Feb. 24, 2011

(51) Int. Cl.
*H01L 21/00* (2006.01)
*H01L 21/84* (2006.01)
*H01L 21/8234* (2006.01)
*H01L 21/336* (2006.01)

(52) U.S. Cl. ... 438/157; 438/212; 438/283; 257/E21.63; 257/E21.632; 257/E21.643

(58) Field of Classification Search ............ 438/157, 438/212, 283; 257/E21.63, E21.632, E21.643
See application file for complete search history.

(56) References Cited

U.S. PATENT DOCUMENTS

| 5,015,594 | A | * | 5/1991 | Chu et al. | 438/207 |
| 5,137,840 | A | * | 8/1992 | Desilets et al. | 438/371 |
| 5,192,708 | A | * | 3/1993 | Beyer et al. | 438/361 |
| 6,642,090 | B1 | * | 11/2003 | Fried et al. | 438/164 |
| 7,309,634 | B2 | * | 12/2007 | Hong | 438/288 |
| 2008/0203491 | A1 | * | 8/2008 | Anderson et al. | 257/372 |
| 2010/0015778 | A1 | * | 1/2010 | Lin et al. | 438/443 |

* cited by examiner

*Primary Examiner* — Walter L Lindsay, Jr.
*Assistant Examiner* — Ron Pompey
(74) *Attorney, Agent, or Firm* — Ingrassia Fisher & Lorenz, P.C.

(57) ABSTRACT

Methods are provided for fabricating Bulk FinFET devices having deep trench isolation. One or more deep isolation trenches are formed in a bulk silicon wafer. Mandrel-forming material is deposited overlying the bulk silicon wafer and dielectric pad layer thereon and simultaneously into the trench(es) as filler material. Mandrels are formed, overetching thereof creating a recess at the trench upper end. A conformal sidewall spacer material from which sidewall spacers are fabricated is deposited overlying the mandrels and into the recess forming a spacer overlying the filler material in the trench(es). Mandrels are removed using the spacer as an etch stop. Fin structures are formed from the bulk silicon wafer using the sidewall spacers as an etch mask. The mandrel-forming material is amorphous and/or polycrystalline silicon.

19 Claims, 5 Drawing Sheets

METHODS FOR FABRICATING BULK FINFET DEVICES HAVING DEEP TRENCH ISOLATION

FIELD OF THE INVENTION

The present invention generally relates to methods for fabricating semiconductor structures, and more particularly relates to methods for fabricating bulk FinFET devices having deep trench isolation (DTI).

BACKGROUND OF THE INVENTION

In contrast to traditional planar metal-oxide-semiconductor field-effect transistors (MOSFETS), which are fabricated using conventional lithographic fabrication methods, nonplanar FETs (Field-Effect Transistors) incorporate various vertical transistor structures, and typically include two or more gate structures formed in parallel. One such semiconductor structure is the "FinFET" which takes its name from the multiple thin silicon "fins" that are used to form the respective gate channels, and which are typically on the order of tens of nanometers in width.

More particularly, referring to the exemplary prior art nonplanar MOS transistor having a FinFET configuration shown in FIG. 1, a FinFET device 10 generally includes one or more parallel silicon fin structures (or simply "fins") 12. The fins extend between a common source electrode and a common drain electrode (not shown in FIG. 1). A conductive gate structure 16 "wraps around" three sides of both fins, and is separated from the fins by a standard gate insulator layer 18. Fins may be suitably doped to produce the desired FET polarity, as is known in the art, such that a gate channel is formed within the near surface of the fins adjacent to the gate insulator 18.

Fin structures (and thus FinFET devices) may be formed on a semiconductor substrate. The semiconductor substrate may be a silicon on insulator (SOI) wafer (not shown). The silicon on insulator (SOI) wafer comprises a silicon-comprising material layer overlying a silicon oxide layer. Fin structures are formed from the silicon-comprising material layer The SOI wafer is supported by a support substrate.

Alternatively, the semiconductor substrate may be a bulk silicon wafer from which the fin structures are formed. The bulk silicon wafer comprises a monolithic block of single crystal silicon. A FinFET device formed from a bulk silicon wafer is referred to herein as a "bulk FinFET device".

Electrical isolation between adjacent fins and between the source and drain electrodes of unrelated FinFET devices is needed. "Unrelated" as used herein means that the devices are not intended to be coupled together. Electrical current leakage is a parasitic effect, which degrades performance of an integrated circuit (IC). When fin structures are formed from the silicon-comprising material layer of an SOI wafer, silicon and thus a conduction path are removed and thus electrical isolation between the fin structures and between unrelated source and drain electrodes is relatively easy.

However, isolating the fin structures and source and drain electrodes of unrelated FinFET devices on a bulk silicon wafer is more problematic as the silicon of the bulk silicon wafer (See e.g., FIG. 11) between the fin structures and source and drain regions forms a conduction path. Isolation trenches have been used to electrically isolate adjacent semiconductor devices formed in a semiconductor substrate. Typical isolation trenches may generally be formed by creating an isolation trench in the semiconductor substrate through an anisotropic etch process, filling the trench with a dielectric material, such as chemical vapor deposition (CVD) silicon oxide ($SiO_2$) or the like, and removing the excess dielectric using a planarization process, such as chemical mechanical polishing (CMP).

In FinFET devices, deep trench isolation (DTI) is generally sought to provide adequate isolation between the source and drain electrodes of unrelated FinFET devices and to substantially prevent latch-up. Shallow trench isolation (STI) is generally used to provide isolation between fin structures. The formation and filling of isolation trenches to provide electrical isolation, particularly deep isolation trenches, is difficult because isolation trenches have high aspect ratios. Aspect ratio is the ratio of the depth of the opening to its width. Even state of the art oxide chemical vapor deposition (CVD) processes such as advanced high density plasma (HDP) or ozone based TEOS (tetraethylorthosilicate) processes cannot reliably fill these high aspect ratio isolation trenches. This causes problems in controlling and creating electrical isolation in bulk FinFET devices, particularly deep trench isolation.

Accordingly, it is desirable to provide methods for forming bulk FinFET devices having deep trench isolation (DTI) between source and drain electrodes of unrelated FinFET devices and to substantially prevent latch-up. In addition, it is desirable to provide methods for forming deep isolation trenches that reduce the number of processing steps conventionally required to form the bulk FinFET device. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for fabricating a bulk FinFET device having deep trench isolation. In accordance with one exemplary embodiment, a method for fabricating a bulk FinFET device having deep trench isolation comprises forming one or more deep isolation trenches in the bulk silicon wafer having a dielectric pad layer thereon. A mandrel-forming material is deposited overlying the dielectric pad layer, the mandrel-forming material also substantially filling the one or more deep isolation trenches. A plurality of mandrels are fabricated from the mandrel-forming material. Overetching of the mandrel-forming material at an upper end of the one or more deep isolation trenches forms a recess. A sidewall spacer material is deposited overlying the plurality of mandrels which fills the recess to form a spacer therein. Sidewall spacers are fabricated from the sidewall spacer material, the sidewall spacers adjacent sidewalls of the plurality of mandrels. The plurality of mandrels are removed using the spacer as an etch stop. The bulk silicon wafer is etched to form a plurality of fin structures therefrom using the sidewall spacers as an etch mask.

In accordance with another exemplary embodiment, a method comprises forming one or more deep isolation trenches in a bulk silicon wafer having a silicon oxide pad layer thereon. A trench liner is formed in the one or more deep isolation trenches. A mandrel-forming material is deposited overlying the silicon oxide pad layer and simultaneously into the one or more deep isolation trenches. The mandrel-forming material comprises at least one of amorphous and polycrystalline silicon. A plurality of mandrels are fabricated from the mandrel-forming material resulting in overetching of the mandrel-forming material at an upper end of the one or more deep isolation trenches to form a recess therein. A conformal sidewall spacer material is deposited overlying the plurality of mandrels and filling the recess at the upper end of the one or more deep isolation trenches to form a spacer therein. Sidewall spacers are fabricated from the sidewall spacer material, the sidewall spacers adjacent sidewalls of the plurality of mandrels. The plurality of mandrels are removed using the spacer as an etch stop. The bulk silicon wafer is etched to form a plurality of fin structures therefrom using the sidewall spacers as an etch mask.

In accordance with another exemplary embodiment, a method comprises forming inter-well isolation in a bulk Fin-FET device. One or more isolation trenches are formed in a bulk silicon wafer having a dielectric pad layer, the one or more isolation trenches adapted to coincide with p-and n-well boundaries in the bulk silicon wafer. The one or more isolation trenches are filled with at least one of amorphous and polycrystalline silicon to form filled isolation trenches. A plurality of fin structures is formed from the bulk silicon wafer.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 2-11 illustrate, in cross section, the initial steps in the method of fabricating a FinFET device 10 from a bulk silicon wafer 20 (hereinafter a "bulk FinFET device") in accordance with exemplary embodiments of the present invention. Such embodiments include the formation of deep trench isolation in the bulk FinFET device.

Figure 2:
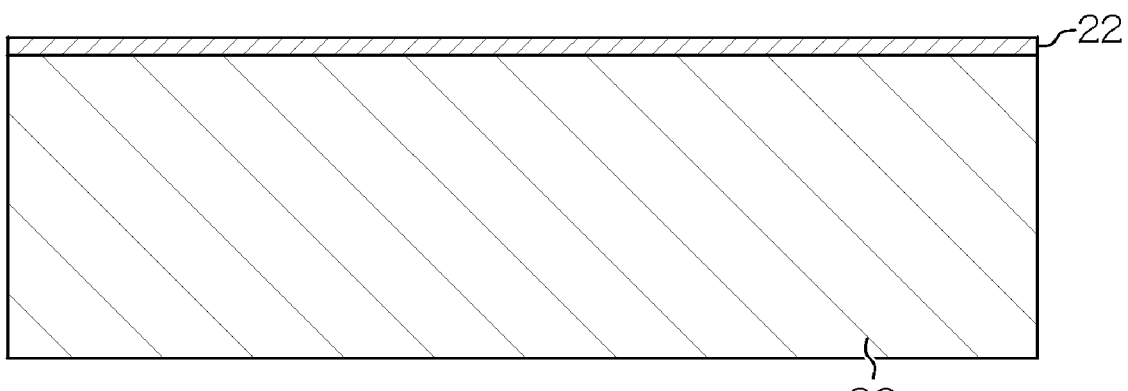
FIGS. 2-11 illustrate, in cross section, the initial steps in methods for fabricating bulk FinFET devices having deep isolation trenches therein, in accordance with exemplary embodiments of the present invention.

Referring to FIG. 2, in accordance with an exemplary embodiment of the present invention, a method of fabricating the bulk FinFET device includes the step of providing the bulk silicon wafer 20. The "bulk silicon wafer" is defined herein as a monolithic block of single crystal silicon. A dielectric layer 22 is formed on the bulk silicon wafer 20. In a preferred embodiment, the dielectric layer 22 is formed as a pad layer. The dielectric layer may comprise a silicon oxide pad layer formed by a known thermal oxidation process. The silicon oxide pad layer has a thickness of from about 3 nm to about 7 nm. FIG. 2 illustrates the bulk silicon wafer 20 with the silicon oxide pad layer on a top surface thereof.

Figure 3:
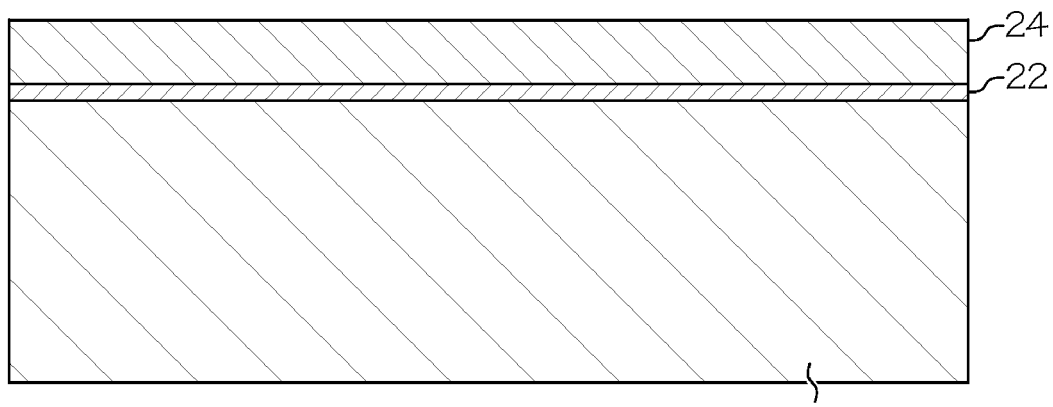

Next, a hard mask layer 24 is formed on the silicon oxide pad layer as shown in cross-section in FIG. 3. The hard mask layer comprises any mask material that exhibits a lower etch rate than the silicon oxide pad layer when subjected to the same etch chemistry. The hard mask layer can be, for example, a layer of silicon nitride (e.g. $Si_3N_4$, $SiN_x$). The silicon nitride layer may be formed by, for example, chemical vapor deposition (CVD). The silicon nitride layer has a thickness of from about 20 nm to about 70 nm.

Figure 4:
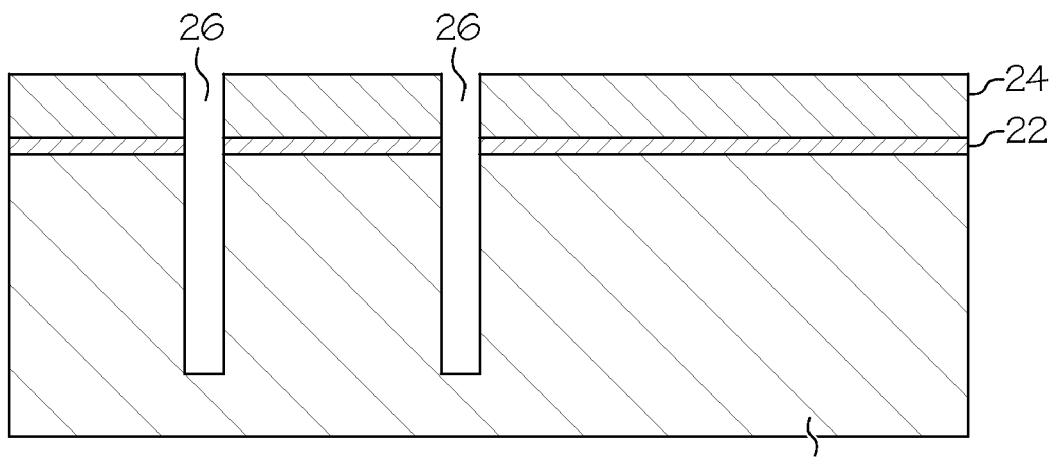

Next, one or more deep isolation trenches 26 are formed in the bulk silicon wafer 20. One or more patterned masks (not shown), such as one or more patterned photoresist layers, are formed on the silicon nitride layer 24. The photoresist layers are used to pattern the silicon nitride layer 24 and etch the bulk silicon wafer to form the one or more deep isolation trenches therein. The bulk silicon wafer 20 may be etched using conventional vertical (anisotropic) etching processes, such as reactive ion etching (RIE). The one or more patterned photoresist layers are removed after forming the one or more deep isolation trenches. FIG. 4 illustrates the resulting structure. The deep trench isolation (DTI) coincides with well boundaries in the bulk silicon substrate to provide source to drain electrode isolation. These source and drain electrodes are formed in subsequent processing steps in the formation of the bulk FinFET device. The deep isolation trenches 26 have a depth of from about 100 nm to about 500 nm, depending on the lateral dimension of the bulk silicon wafer in which they are formed. The width of the deep isolation trenches depends on the technology node. The aspect ratio (depth:width ratio) of the one or more deep isolation trenches may be from about 12:1 to about 3:1.

Figure 5:
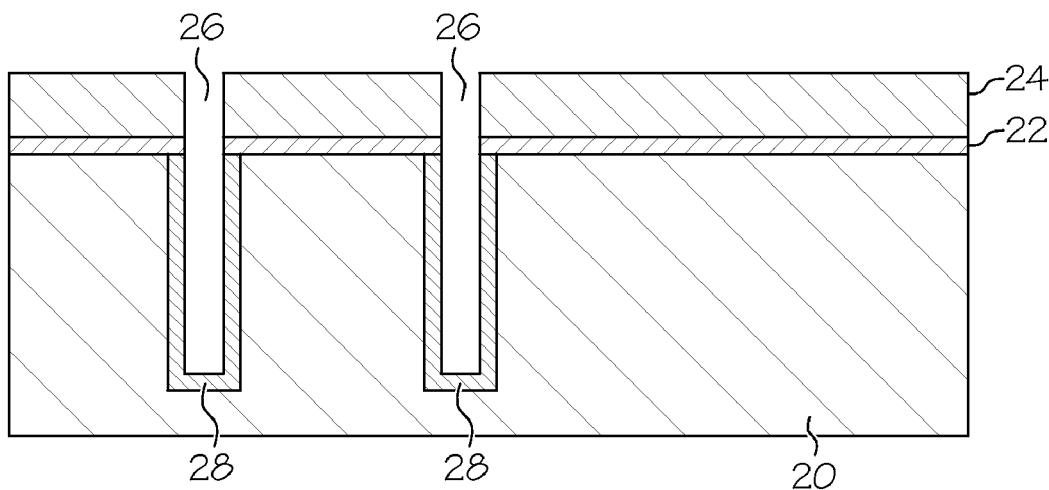

A trench liner 28 as shown in FIG. 5 may be formed on the sidewalls and bottom wall of the one or more deep isolation trenches 26 by an oxidation process such as thermal oxidation at temperatures of from about 700 to about 1100 degrees Celsius. Alternatively, the trench liner may be formed by depositing an electrically isolating material by a deposition process such as chemical vapor deposition (CVD). The electrically isolating material may be selected from oxide, oxynitride, silicon nitride or the like. The thickness of the trench liner 28 may be from about 2 nm to about 10 nm.

Figure 6:
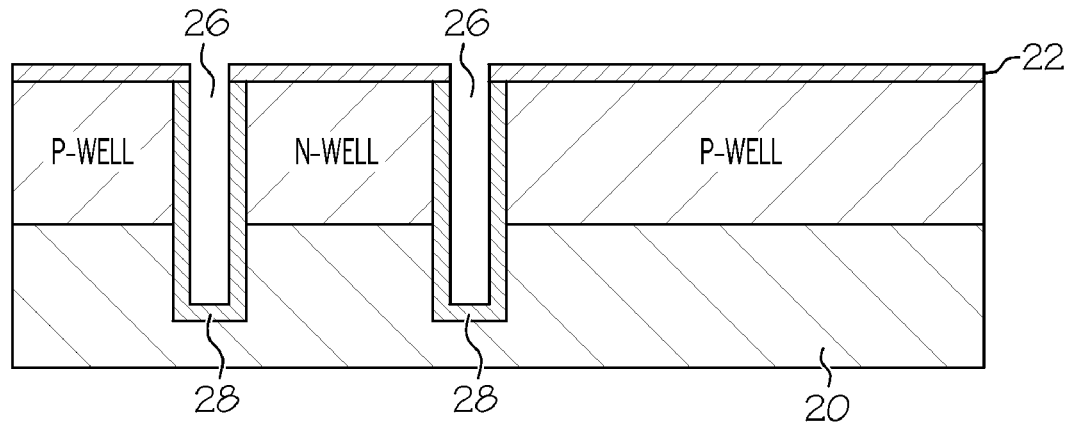

In the next step, the silicon nitride layer 24 is removed or stripped, for example, by an isotropic etchant in a wet etching process in a solution of hot phosphoric acid ($H_3PO_4$). The resulting structure is shown in FIG. 6. The silicon nitride may also be removed by plasma etching.

Next, a patterned photoresist (not shown) as known in the art is used as an ion implantation mask and conductivity determining ions are implanted into exposed portions of the bulk silicon wafer so as to form P-wells and N-wells depending on the integrated circuit (IC) being implemented. For example, FIG. 6 illustrates a pair of deep isolation trenches separating p-wells from an n-well in the bulk silicon wafer. It is to be appreciated that the one or more deep isolation trenches define the well boundaries. The photoresist is then stripped to remove any residual material in the one or more deep isolation trenches.

Figure 7:
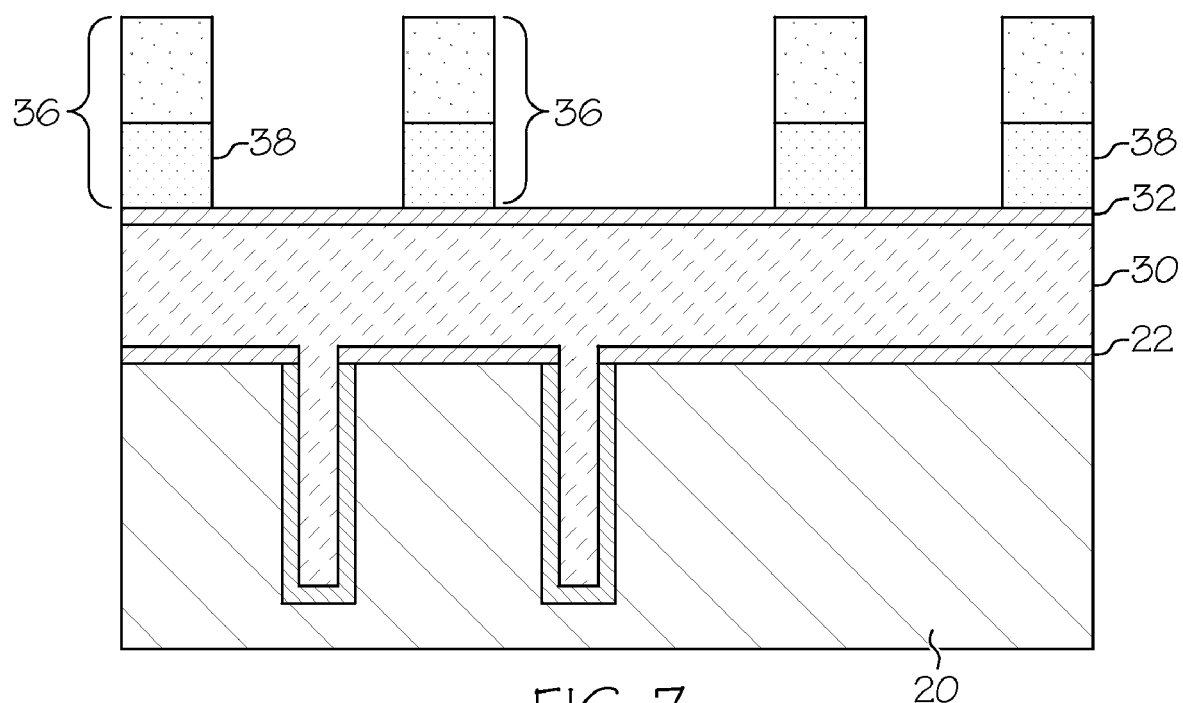

Referring next to FIG. 7, a layer of mandrel-forming material 30 is deposited on the silicon oxide pad layer 22. The layer of mandrel-forming material simultaneously fills the one or more deep isolation trenches. In a preferred embodiment, the mandrel-forming material comprises amorphous or polycrystalline silicon. The mandrel-forming material that fills the one or more deep isolation trenches is hereinafter referred to as "filler material." The mandrel-forming material may be deposited using low pressure chemical vapor deposition (LPCVD), and other chemical vapor deposition (CVD) and atomic layer deposition (ALD) processes. The same amorphous or polycrystalline silicon is used in a single step to both fill the one or more deep isolation trenches and to deposit mandrel-forming material for the formation of the mandrels as hereinafter described. At least one of amorphous and polycrystalline silicon is used because it provides superior fill for high aspect ratio trenches. In accordance with one embodiment, after deposition of the layer of mandrel-forming material, a secondary silicon oxide layer 32 is formed over the mandrel-forming layer 30.

Figure 8:
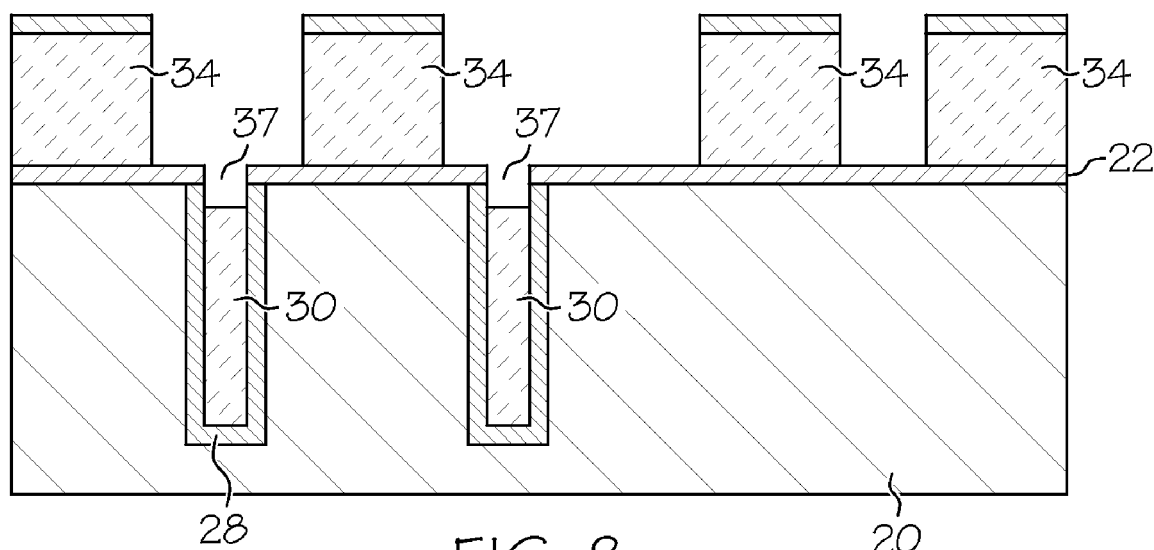

Next, a plurality of mandrels 34 is formed. One or more patterned masks 36, such as one or more patterned photoresist layers, are formed on the secondary silicon oxide layer. The one or more patterned photoresist layers, as shown in FIG. 7, may include an underlying optical planarization layer (OPL) layer 38. The OPL layer may be an organic material that is not photosensitive. As is known in the art, the one or more patterned photoresist layers are used as an etch mask to pattern and etch the exposed secondary silicon oxide layer 32 and the mandrel-forming layer 30 to form the plurality of mandrels as shown in FIG. 8. The exposed secondary silicon oxide layer and the mandrel-forming layer may be etched using conventional vertical (anisotropic) etching processes, such as reactive ion etching (RIE). The one or more patterned photoresist layers are thereafter removed. As will be discussed in more detail below, it is desirable to slightly overetch the mandrel-forming material/filler material 30 in the upper end of the one or more deep isolation trenches to form a recess 37 for purposes as hereinafter described (See, FIG. 8). The etchant for the mandrel-forming material is selected to etch mandrel-forming layer 30 at a higher rate than the trench liner 28.

Figure 9:
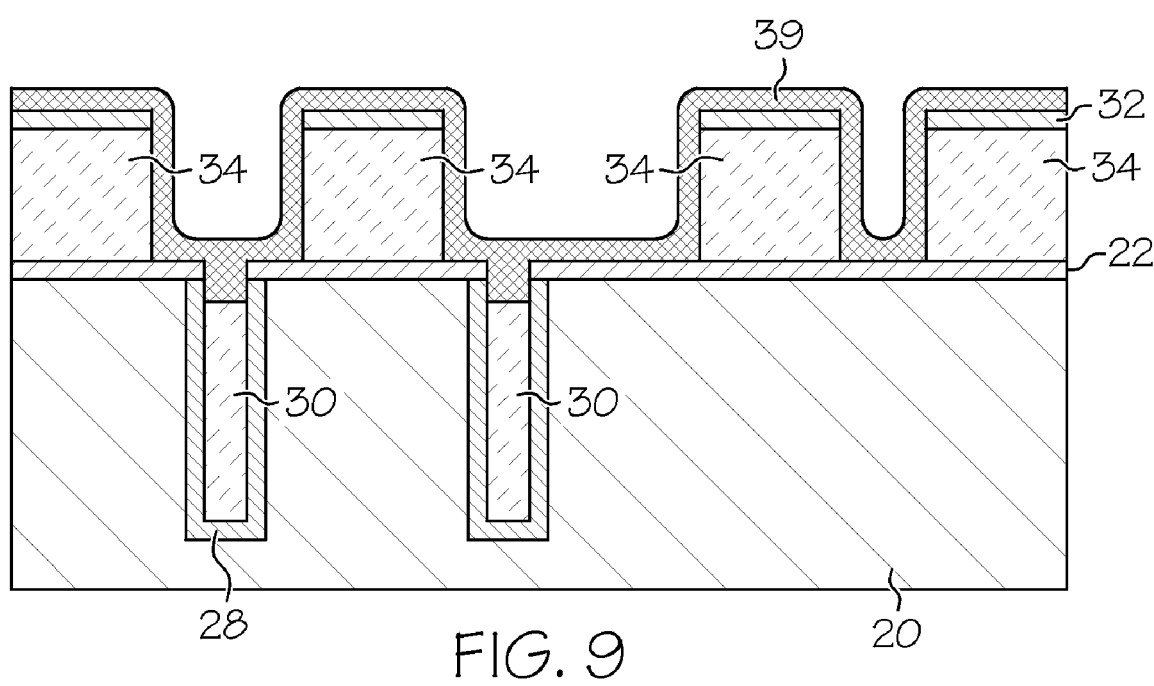
Figure 10:
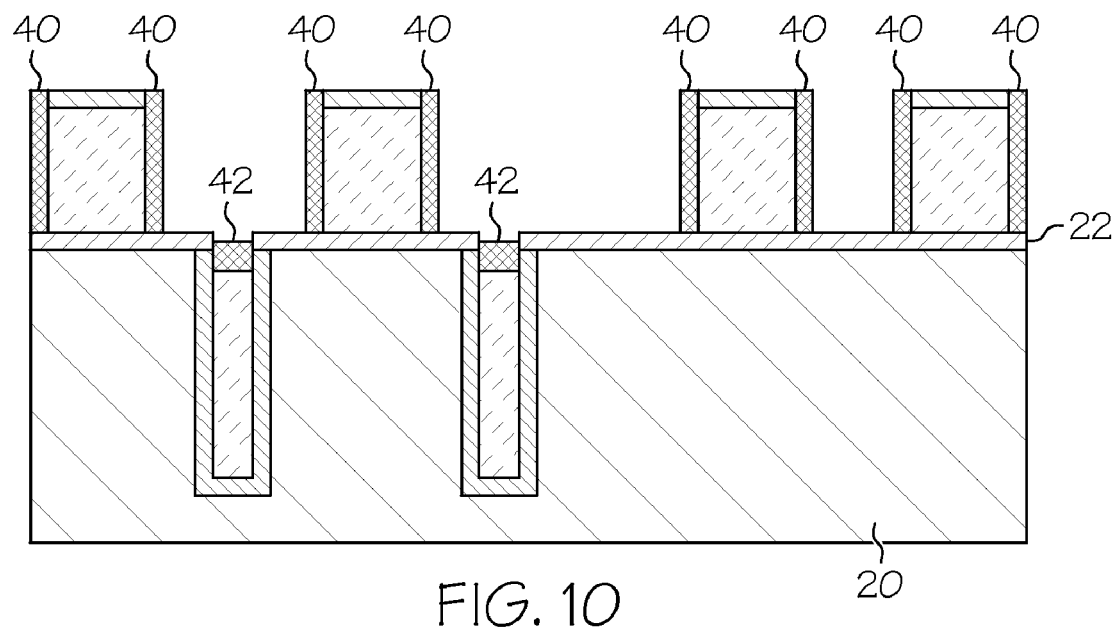

After formation of the plurality of mandrels as shown in FIG. 8, an insulating sidewall spacer material layer 39 is uniformly and conformally deposited overlying the plurality of mandrels 34 and any remaining secondary silicon oxide layer 32, as illustrated in FIG. 9. The sidewall spacer material layer preferably comprises silicon nitride deposited by, for example, low pressure chemical vapor deposition (LPCVD). The sidewall spacer material also fills the recess 37 at the upper end of each of the one or more deep isolation trenches 26. The insulating sidewall spacer material layer is then partially anisotropically etched leaving sidewall spacers 40 on the plurality of mandrels 34 and a spacer 42 in the recess 37 at the upper end of each of the one or more deep isolation trenches for purposes as hereinafter described. The sidewall spacers 40 and spacer 42 originate from the same deposition. The spacer 42 and filler material together substantially fill the one or more deep isolation trenches. The resulting structure is shown in FIG. 10.

While the use of silicon nitride has been described as the sidewall spacer material which forms the sidewall spacers 40 and spacer 42, the invention is not so limited. For example, $SiO_2$, SiC and other insulating conformally deposited materials may be used as the sidewall spacer material.

Figure 11:
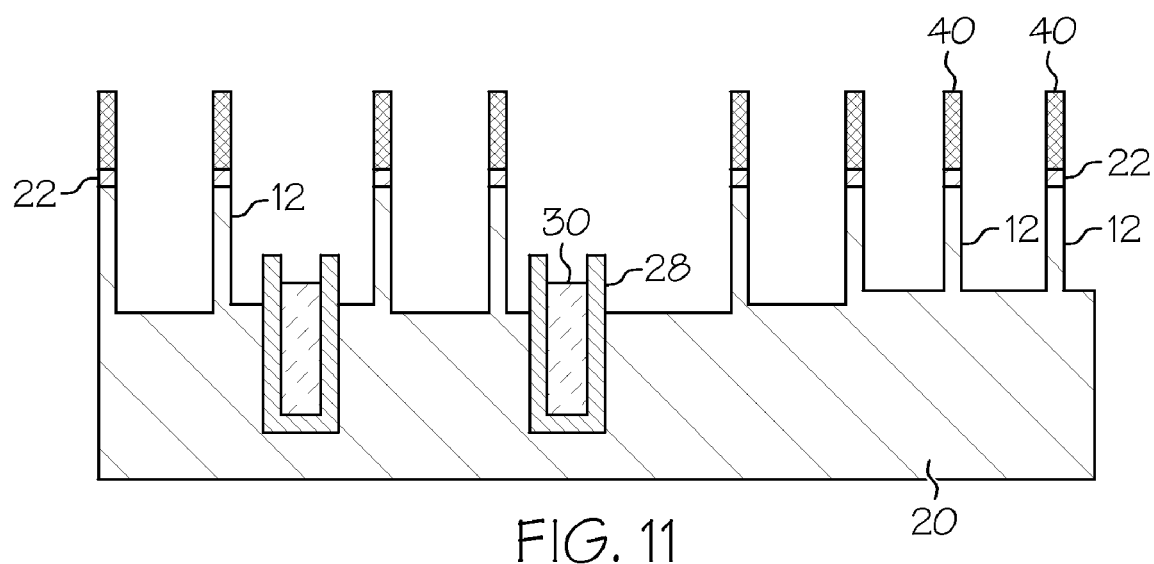

Referring to FIG. 11, the plurality of mandrels, any silicon oxide pad layer not masked by the plurality of sidewall spacers 40, and any remaining secondary silicon oxide layer are then removed using an etch chemistry suitable for etching the mandrels while leaving the sidewall spacers 40 intact. Suitable etch processes and chemistries include those used for the silicon etch of FIG. 5, i.e., halide and/or fluorocarbon containing reactants. The spacer 42 at the upper end of each deep isolation trench provides an etch stop to substantially prevent etching of the mandrel-forming material/filler material 30 within the one or more deep isolation trenches when the plurality of mandrels are removed. The bulk silicon wafer 20 is then etched to form the fin structures 12 with the sidewall spacers 40 used as an etch mask.

Fin structures may be etched using any conventional etch process, including but not limited to, anisotropic etching processes (e.g. reactive ion etching (RIE) or the like). Thereafter, depending on the final design implementation, the resulting structure shown in FIG. 11 may be used to fabricate one or more bulk FinFET devices and one or more fin structures 12 may be removed following fabrication of the structure shown in FIG. 11.

The deep isolation trenches in the bulk silicon wafer provide isolation between the source and drain electrodes of unrelated FinFET devices and to substantially prevent latch-up. The fin to fin isolation and source and drain electrodes are formed in subsequent processing steps in the fabrication of the FinFET device. The spacer 42 may be removed in these subsequent processing steps.

It is to be appreciated that in an alternative embodiment, the step of depositing a mandrel-forming material on the silicon oxide pad layer may be performed after substantially filling the one or more deep isolation trenches with at least one of amorphous and polycrystalline silicon with the excess removed using a planarization process, such as chemical mechanical polishing (CMP) or the like.

Figure 1:
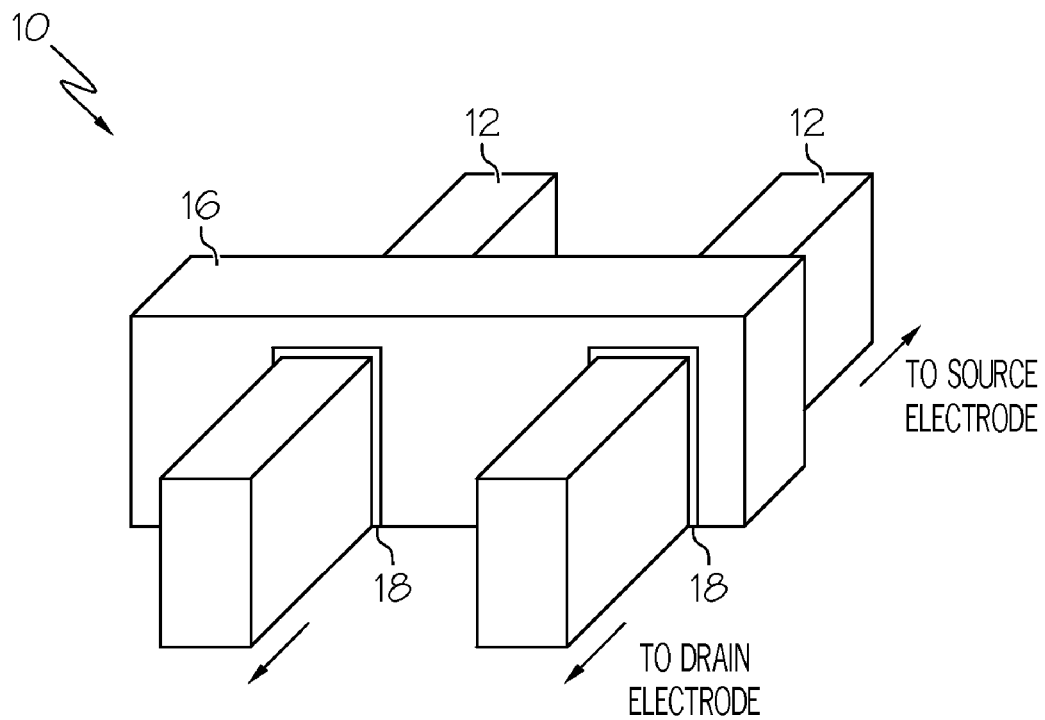
FIG. 1 is an isometric schematic view of a FinFET structure available in the prior art.

After the fin structures 12 are formed and cleaned, and the remaining silicon oxide pad layer 22 and sidewall spacers 40 removed from the top of the fin structures by conventional processes, conventional fabrication processing can be performed to complete the FinFET device as illustrated in FIG. 1. A gate insulator 18 is formed overlying the fin structures 12 and a gate electrode forming material such as polycrystalline silicon is deposited over the gate insulator. The gate electrode forming material is patterned to form at least one gate electrode 16 as is known in the art. The gate electrode is then used as an ion implantation mask and conductivity determining ions are implanted into exposed portions of the fin structures in self alignment with the gate electrode to form the source and drain regions (not shown in FIG. 1). As those skilled in the art will appreciate, the ion implantation mask may also include sidewall spacers formed on the sides of the gate electrodes and multiple ion implantations may be used to form the source and drain electrodes.

From the foregoing, it is to be appreciated that bulk FinFET devices may be formed having well-controlled and effective deep trench isolation. Such bulk FinFET devices may be fabricated in fewer processing steps by replacing a multi-step process with a single step process using the same amorphous or polycrystalline silicon to both fill the deep isolation trenches and to form the mandrels during fabrication of the bulk FinFET device resulting in time and cost savings as well as simplifying the fabrication process. In addition, using amorphous or polycrystalline silicon as the filler material in the deep isolation trenches provides improved trench fill capabilities.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:
1. A method for fabricating a bulk FinFET device having deep trench isolation comprising the steps of:
forming one or more deep isolation trenches in a bulk silicon wafer;
depositing a mandrel-forming material on the bulk silicon wafer, the mandrel-forming material also substantially filling the one or more deep isolation trenches as filler material, wherein the mandrel-forming material comprises at least one of amorphous and polycrystalline silicon;
fabricating a plurality of mandrels from the mandrel-forming material and overetching the mandrel-forming material at an upper end of the one or more deep isolation trenches to form a recess;
depositing a sidewall spacer material overlying the plurality of mandrels and into the recess to form a spacer therein;
fabricating sidewall spacers from the sidewall spacer material, the sidewall spacers adjacent sidewalls of the plurality of mandrels;
removing the plurality of mandrels using the spacer as an etch stop;
etching the bulk silicon wafer to form a plurality of fin structures therefrom using the sidewall spacers as an etch mask.

2. The method of claim 1, wherein the step of forming one or more deep isolation trenches comprises forming one or more deep isolation trenches with an aspect ratio of from about 12:1 to about 3:1.

3. The method of claim 1, wherein the step of depositing mandrel-forming material on the bulk silicon wafer comprises simultaneously filling the one or more deep isolation trenches.

4. The method of claim 1, wherein the step of substantially filling the one or more deep isolation trenches precedes the step of depositing mandrel-forming material on the bulk silicon wafer.

5. The method of claim 1, further comprising the steps of:
forming a source electrode adjacent a first end of each of the fin structures and a drain electrode adjacent a second end of each of the fin structures with deep trench isolation in the bulk silicon wafer separating unrelated source and drain electrodes; and
forming a gate over the plurality of fin structures.

6. The method of claim 1, wherein the step of depositing the sidewall spacer material into the recess to form the spacer comprises depositing sidewall spacer material overlying the filler material in the one or more deep isolation trenches.

7. The method of claim 1, wherein the step of forming one or more deep isolation trenches in the bulk silicon wafer further comprises the step of forming a trench liner in the one or more deep isolation trenches, the trench liner comprised of a material having a lower etch rate than the mandrel-forming material.

8. The method of claim 1, wherein the step of depositing the sidewall spacer material comprises depositing silicon nitride.

9. A method, comprising:
forming one or more deep isolation trenches in a bulk silicon wafer having a silicon oxide pad layer thereon;
forming an insulating trench liner in the one or more deep isolation trenches;
depositing a mandrel-forming material overlying the silicon oxide pad layer, the mandrel-forming material simultaneously substantially filling the one or more deep isolation trenches, wherein the mandrel-forming material comprises at least one of amorphous and polycrystalline silicon;
fabricating a plurality of mandrels from the mandrel-forming material and overetching the mandrel-forming material at an upper end of the one or more deep isolation trenches to form a recess therein;
depositing a conformal sidewall spacer material overlying the plurality of mandrels and filling the recess at the upper end of the one or more deep isolation trenches to form a spacer therein;
fabricating sidewall spacers from the sidewall spacer material, the sidewall spacers adjacent sidewalls of the plurality of mandrels;
removing the plurality of mandrels using the spacer as an etch stop; and
etching the bulk silicon wafer to form a plurality of fin structures therefrom using the sidewall spacers as an etch mask.

10. The method of claim 9, wherein the step of forming one or more deep isolation trenches comprises forming one or more deep isolation trenches with an aspect ratio of from about 12:1 to about 3:1.

11. The method of claim 9, wherein the step of depositing the sidewall spacer material into the recess to form the spacer comprises depositing sidewall spacer material overlying the filler material in the one or more deep isolation trenches.

12. The method of claim 9, wherein the step of forming the insulating trench liner comprises one of depositing and growing an insulating material having a lower etch rate than the mandrel-forming material.

13. The method of claim 9, wherein the step of depositing a conformal sidewall spacer material comprises depositing silicon nitride.

14. A method of forming inter-well isolation in a bulk FinFET device comprising the steps of:
forming one or more isolation trenches in a bulk silicon wafer having a dielectric pad layer, the one or more isolation trenches adapted to coincide with p- and n- well boundaries in the bulk silicon wafer;
filling the one or more isolation trenches with at least one of amorphous and polycrystalline silicon to form filled isolation trenches; and
forming a plurality of fin structures from the bulk silicon wafer, the step of forming a plurality of fin structures comprising:
depositing at least one of amorphous and polycrystalline silicon overlying the dielectric pad layer and the filled isolation trenches;
fabricating a plurality of mandrels from the at least one of amorphous and polycrystalline silicon;
depositing a sidewall spacer material overlying the plurality of mandrels;
fabricating sidewall spacers from the sidewall spacer material, the sidewall spacers adjacent sidewalls of the plurality of mandrels;
removing the plurality of mandrels; and
etching the bulk silicon wafer to form the plurality of fin structures therefrom using the sidewalls spacers as an etch mask.

15. The method of claim 14, wherein the step of depositing the at least one of amorphous and polycrystalline silicon overlying the dielectric pad layer and the filled isolation trenches is substantially simultaneous with the step of filling the one or more isolation trenches.

16. The method of claim 14, wherein the step of fabricating the plurality of mandrels further comprises:
overetching the at least one of amorphous and polycrystalline silicon at an upper end of the one or more deep isolation trenches to form a recess therein; and
wherein the step of depositing the sidewall spacer material further comprises filling the recess with sidewall spacer material that is used as an etch stop during the mandrel removal step.

17. The method of claim 14, wherein the step of forming one or more isolation trenches comprises forming one or more deep isolation trenches with an aspect ratio of from about 12:1 to about 3:1.

18. The method of claim 14, wherein the step of forming one or more isolation trenches in the bulk silicon wafer further comprises the step of forming a trench liner in the one or more deep isolation trenches, the trench liner comprised of a material having a lower etch rate than the at least one amorphous and polycrystalline silicon.

19. The method of claim 14, wherein the step of depositing the sidewall spacer material comprises depositing silicon nitride.

* * * * *